United States Patent [19]
Barrow et al.

[11] Patent Number: 5,036,322
[45] Date of Patent: Jul. 30, 1991

[54] DIGITAL-TO-ANALOG CONVERTERS WITH IMPROVED LINEARITY

[75] Inventors: Jeffrey Barrow, Oak Ridge; William J. Pratt; Henry T. Tsuei, both of Greensboro, all of N.C.

[73] Assignee: Analog Devices, Inc., Norwood, Mass.

[21] Appl. No.: 360,410

[22] Filed: Jun. 2, 1989

[51] Int. Cl.$^5$ .............................................. H03M 1/66
[52] U.S. Cl. .................................... 341/144; 341/118; 341/155
[58] Field of Search ............... 341/118, 144, 155, 159; 307/270, 296.1

[56] References Cited

U.S. PATENT DOCUMENTS

| | | | |
|---|---|---|---|
| 4,492,954 | 1/1985 | Harris et al. | 341/118 |
| 4,573,005 | 2/1986 | van de Plassche | 341/118 |
| 4,864,215 | 9/1989 | Schouwenaars et al. | 341/144 |
| 4,874,964 | 10/1989 | Kondo | 341/144 |

Primary Examiner—William M. Shoop, Jr.
Assistant Examiner—Marc S. Hoff
Attorney, Agent, or Firm—Wolf, Greenfield & Sacks

[57] ABSTRACT

High accuracy is achieved by employing, in conventional DAC architectures, very accurate current sources. To create these high-accuracy current sources, the outputs of several smaller, less accurate, nominally equal current sources are summed. A procedure is taught for selecting the number of current sources to achieve an arbitrary degree of accuracy with a desired level of confidence. Assuming the current sources are taken from a population whose output currents deviate from a design value according to a normal distribution, the minimum number of constituent current sources, n, required to provide an accurate total current is given by the formula $n=(Z\sigma/E)^2$, where Z is a number which corresponds to the probability that the output will fall within an error band E (i.e., a predetermined accuracy level) with a predetermined level of confidence, $\sigma$ is the standard deviation of the population.

6 Claims, 4 Drawing Sheets

DIGITAL-TO-ANALOG CONVERTERS WITH IMPROVED LINEARITY

FIELD OF THE INVENTION

This invention relates to the field of digital-to-analog converters and, more particularly, to digital to analog converters designed to provide a high-resolution, highly accurate conversion.

BACKGROUND OF THE INVENTION

Digital-to-analog converters (DAC's) are widely used in a variety of situations in which analog signals must be produced from digital information provided as digital words. The number of bits of resolution in the digital word, the speed of conversion, the integral and differential linearity, and the accuracy of the conversion are dominant parameters which characterize a DAC. Some applications require very high speed DAC's, some require very high resolution DAC's, and many require highly linear, highly accurate DAC's. In many uses, high integral linearity and high accuracy are even more important than resolution. Thus, a DAC with five- to eight-bit resolution may be adequate where conversion to an accuracy of twelve or fourteen bits is required.

Such requirements for high accuracy place severe constraints on matching components within the DAC. A typical DAC will consist of many current sources, each of which is switched (i.e., turned on or off), depending on the value of the digital input. The currents are summed to produce the analog output current. The accuracy of the DAC output is fundamentally limited by the accuracy of these current sources. Typically, $2^n-1$ current sources, or fewer, are employed to provide the analog output. Lower resolution DAC's (e.g., up to about eight bits) can be made directly, by employing techniques such as R-2R ladders, binarily weighted current sources, and so forth. Conventional manufacturing process technology, however, generally allows only about 10-bit accuracy in matching components, such as current sources. Eight-bit accuracy is more typical from customary processes. A DAC accurate to twelve bits, however, typically requires more complex processing, because the simple component matching requirements can not be achieved using current process technologies. Thus, alternative approaches such as laser trimming, "zener zapping", and the like, are used. Unfortunately, these alternative approaches generally are associated with higher cost and lower manufacturing yields.

OBJECTS AND SUMMARY OF THE INVENTION

Accordingly, it is an object of the present invention to provide a DAC architecture or architectures capable of yielding high accuracy conversions over the entire dynamic range of operation.

A further object of the invention is to provide such a DAC architecture(s) which is readily fabricated, using existing process technologies.

Still another object of the invention is to provide such high accuracy DAC s which are also capable of high resolution.

The foregoing and other objects of the invention are achieved by employing, in conventional DAC architectures, very accurate current sources. To create these high accuracy current sources, the outputs of several smaller, and less accurate, current sources are summed. The smaller current sources are preferably designed to provide the same output currents.

The number of current sources needed for a desired degree of accuracy is a function of several variables. A procedure is taught for selecting the number of current sources to achieve an arbitrary degree of accuracy (i.e., tolerance) with a desired level of confidence. Assuming the current sources are taken from a population of like current sources whose output currents deviate from a nominal value according to a normal distribution, the number of constituent current sources, n, required to provide an accurate total current is given by the formula $n=(Z\sigma/E)^2$, where E is the error to be tolerated (or, equivalently, the accuracy required), Z is a number which corresponds to the probability that the current will be within said tolerance of the desired value with a predetermined level of confidence, and $\sigma$ is the standard deviation of the population of current sources.

The invention will be more fully understood from the detailed description below, which should be read in conjunction with the accompanying drawing.

DETAILED DESCRIPTION

According to the present invention, a DAC is formed of a plurality of current sources, whose outputs are summed to form the desired analog output current. Preferably, the current sources are monolithically fabricated—i.e., they are all formed on a single integrated circuit. Though each current source is designed to have an intended current output, its actual output differs from its intended output due to process variations. The deviation between the actual output value of such current sources and their design value has been observed to follow, in general, a normal distribution.

Figure 1:
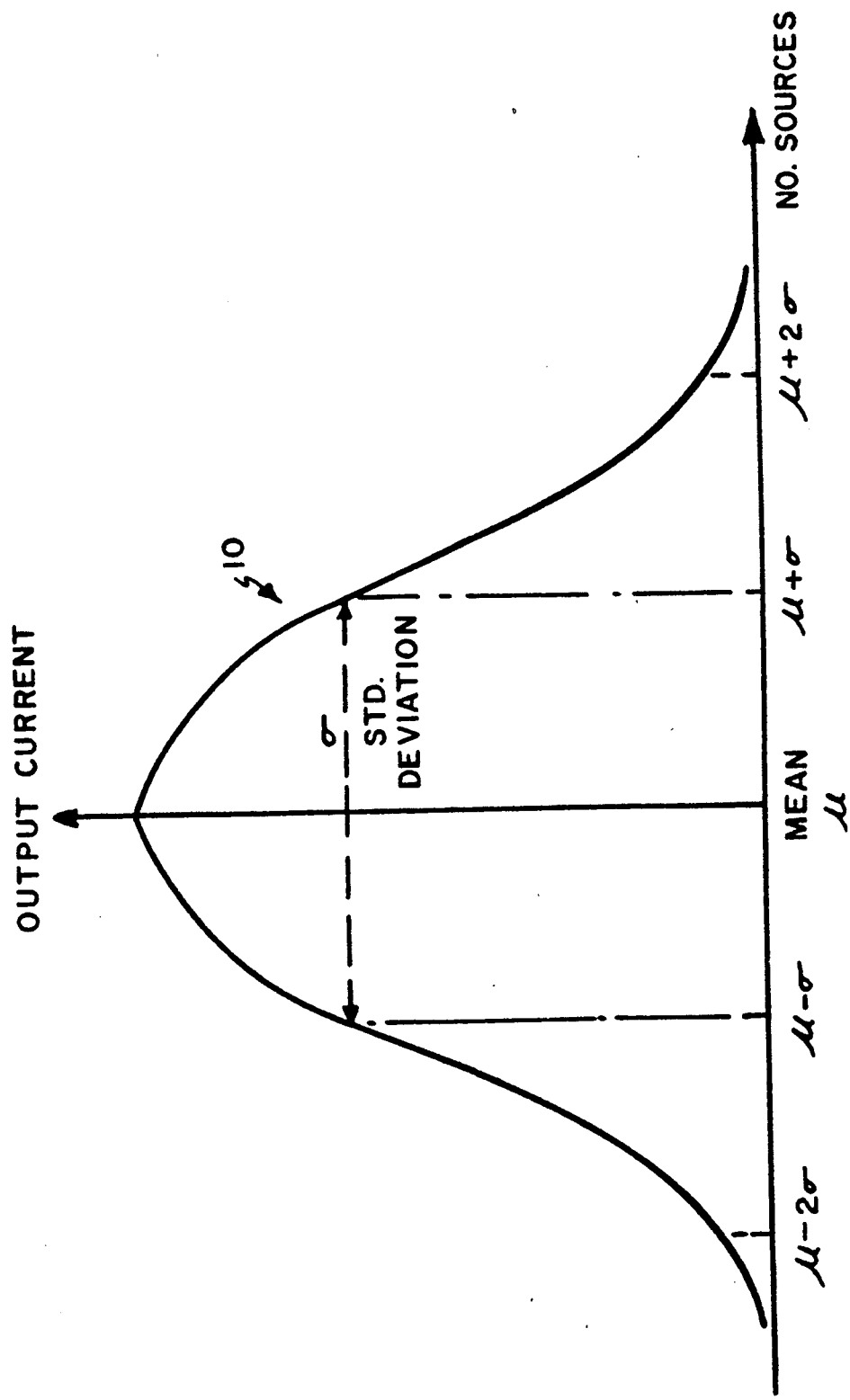
FIG. 1 is an illustration of a normal distribution for the output of a population of current sources, all of which are nominally to provide the same output current.

Referring to FIG. 1, a typical, normal distribution 10 is shown for the actual output current from a population of current sources designed to have the same output current It is assumed that the population includes an essentially unlimited (i.e., infinite) number of current sources. The output of the current source population will have a mean value u and a standard deviation $\sigma$. For a sample of n sources taken from the population, the average value of its output current for the group, $u_n$, will approach the average value for the entire population, u. If the number of samples, n, is infinite, then the population mean $u_n$ and the sample mean u will be exactly equal; otherwise, they will be different by some quantity E, thus $u_n-u=E$. Therefore, to provide a DAC of some desired, high accuracy, it is necessary to employ a number of current sources, n, such that their average value (or equivalently their sum) will be within a stated tolerance band ±E of the population mean, with a given degree of confidence. The formula below, taken from statistical sampling theory, provides the point of departure: $n=(Z\sigma/E)^2$, where Z is a number which indicates the probability that the output will fall within the error band E with a predetermined level of confidence, $\sigma$ is the standard deviation of the population, and E is the error band to be tolerated. The number Z is taken from conventional tables for normal distributions, where Z is the value of the random variable for which the desired portion of the area under the distribution curve is included. Thus, if there are n current sources having a mean u, that is, within ±E of a population mean u, then the sum of the n current sources will be within ±E of the ideal population mean times n—i.e., un. Consequently, a very accurate current source for providing a current I can be created from a group of n less-accurate current sources, each providing current I/n. If the output contribution for each bit of a DAC's input is formed this way, the actual analog output will match the ideal value to within the given error band.

Consider as an example a 12-bit DAC whose most significant-bit (MSB) will contribute 10.24 mA output current. This DAC is to be formed from 64 current sources whose average value is within ±E of the ideal value. For the MSB to be accurate to within one-half LSB, $E=2^{-13}$. Assume that the average value is at its worst case minimum value $I_{avg}=160$ uA $-160$ uA$*2^{-13}$. The value of the MSB will thus be $64*I_{avg}=10.23875$ mA. This is within one-quarter LSB of the ideal value of 10.24 mA, which is within one-half LSB when referred to the full scale current.

The number of current sources, n, required to produce a desired level of accuracy, when the current sources are taken from a current source population of known standard deviation, as a function of desired yield, is given by the formula $n=(Z*2^{x-y})^2$, where $E=\pm 2^{-x}$, $\sigma=2^{-y}$ and the desired confidence level (or yield) is expressed in terms of Z. Table I below gives a few values of Z for selected yield criteria. The number of current sources thus depends on the desired yield, the standard deviation, and the error band (i.e., inaccuracy) which can be tolerated.

TABLE I

| yield | Z |
|---|---|
| 50% | 0.68 |
| 70% | 1.04 |
| 80% | 1.28 |
| 90% | 1.65 |

The number of required current sources increases with desired yield, with the standard deviation of the current source population, and with tightening of the acceptable tolerance band.

Figure 2:
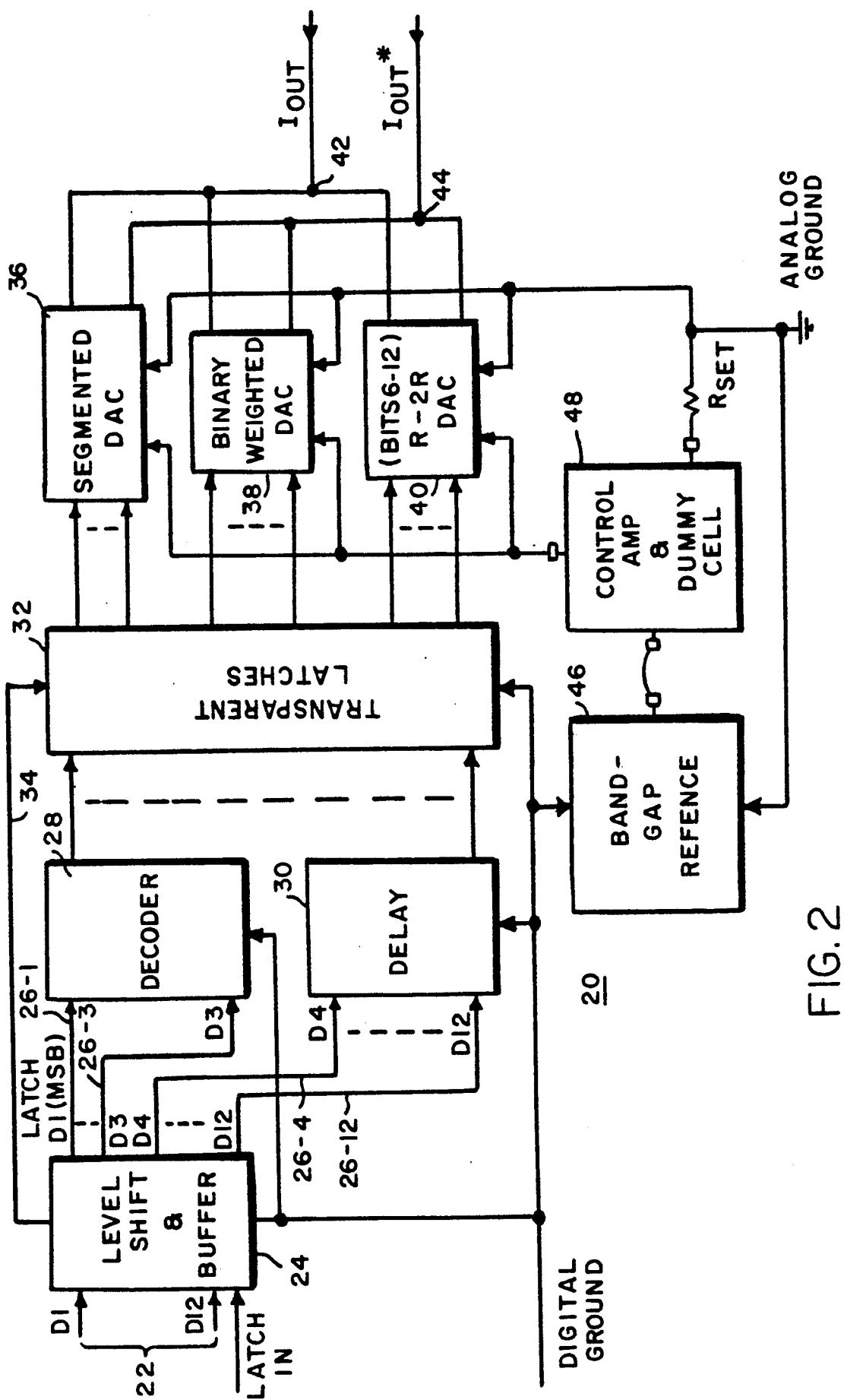
FIG. 2 is a block diagram of a first embodiment of a DAC employing the present invention.

A block diagram of a first embodiment of a DAC 20 according to the present invention is shown in FIG. 2. The digital data is a 12-bit word D1–D12 supplied on a bus 22 to a front end 24, which comprises a level shifter (if necessary) and buffer, with a differential output for each bit. The output of the level shift/buffer 24 is a split data path. One or more of the most significant bits, such as the three bits D1–D3, are supplied via lines 26-1 through 26-3 to a decoder 28. The remaining bits (LSB's), such as the nine bits D4–D12, are supplied via lines 26 4 through 26-12 to a delay section 30. The purpose of delay section 30 is to equalize the propagation delays for all bits. The MSB's are decoded in decoder 28. The output of decoder 28 and delay circuit 30 are supplied to a set of transparent latches 32. There may, for example, be sixteen transparent latches. The transparent latches either pass or hold the data, depending upon the state of a latch signal supplied on line 34 from the level shifter/buffer 24.

The transparent latches supply three sets of outputs. A first set of outputs feeds the LBS's to an upper, segmented DAC 36, which may, for example, accept the first three or four most significant bits. A second group of transparent latch outputs is supplied to a binary-weighted DAC 38, which may accept, for example, the fourth through sixth or fifth through sixth bits. The remaining transparent latch outputs are supplied to an R-2R DAC 40, which may, for example, accept the sixth through twelfth bits. Each of DAC's 36, 38 and 40 supplies a pair of double-ended current outputs. A first one of the outputs of each DAC output is summed at an output node 42, to produce first output current $I_{out}$. A second one of the outputs of each DAC is summed together at an output node 44, to produce the complementary differential output $I^*_{out}$.

The DAC's, of course, contain current sources, which require a reference voltage input to set up the proper DAC current. This reference is supplied by the combination of a bandgap reference cell 46 and a control amplifier/dummy cell 48.

Of course, the binary weighted DAC may be omitted, in which event MSB's and LSB's may be divided between the segmented DAC and the R-2R DAC.

The segmented DAC 36 may be a DAC according to the present invention. In this case, the DAC 36 may, for example, be a DAC built using the same architecture as an R-2R DAC except that each current source (i.e., resistance and switch) is formed of a plurality of parallel, summed current sources, with the number of parallel current sources for each bit being established as provided herein.

Figure 3:
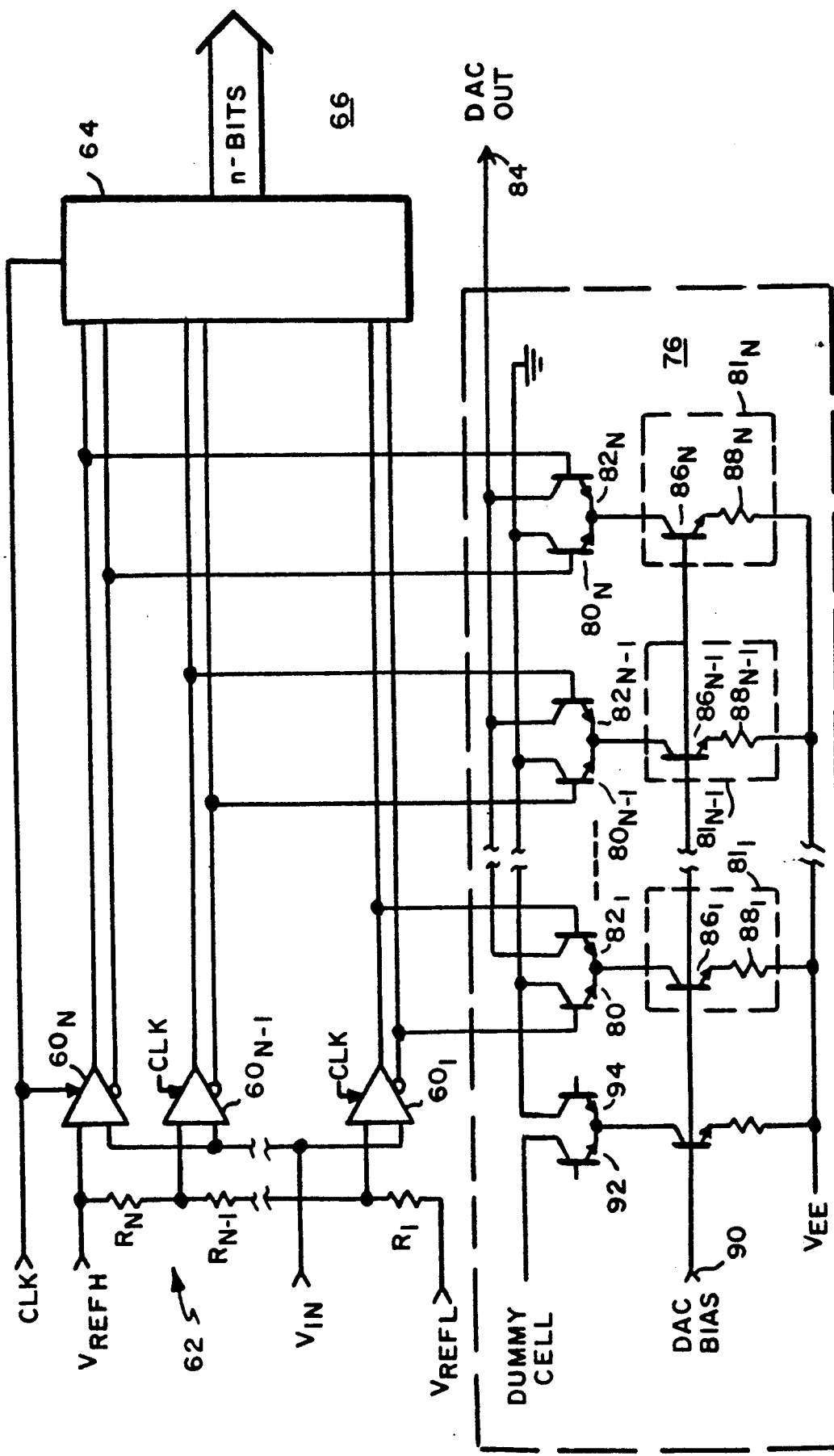
FIG. 3 is a simplified, partially schematic, partially-block diagram of a second embodiment of a DAC employing the present invention.

FIG. 3 shows a second example of the use of the method according to the present invention. The figure shows a portion of a subranging analog to-digital converter, which is more fully described in U.S. patent application Ser. No. 7/241,379 filed Sept. 7, 1988 in the name of Henry T. Tsuei, titled SUBRANGING ANALOG TO DIGITAL CONVERTER WITHOUT DELAY LINES, assigned to the same assignee as the present inventions. The specification of said application No. 07/241,379 is hereby incorporated by reference for any discussion of FIG. 3 not expressly contained herein.

FIG. 3 illustrates a flash converter 66 connected to a DAC 76. The flash converter 66 more particularly comprises $N=2^n-1$ comparators $60_1$ through $60_n$, a voltage divider 62, and an encoder 64. The voltage divider 62 spans two reference voltages, labelled $V_{refh}$ and $V_{refl}$, and in the illustration is formed by a series string of $2^n-1$ identical resistors labelled $R_1$ through $R_n$. Each comparator provides a pair of complementary outputs which shall be identified as the uninverted and inverted outputs. The encoder 64 provides a binary word. For purposes of this invention, the details of the encoder 64 are unimportant, and any suitable encoder may be used, several of which are known in the prior art.

The DAC 76 comprises a series of transistor switches, each formed of a pair of emitter-coupled transistors $80_i$ and $82_i$ (where i ranges from 1 to N), whose bases are driven by the non inverted and inverted outputs, respectively, of a corresponding one of comparators $60_i$.

The collectors of the switch transistors $80_i$, whose bases are driven by the inverted comparator outputs, are all connected to digital ground, while the collectors of the switch transistors $82_i$ whose bases are driven by he non inverted comparator outputs, are connected in parallel to the output node 84 of the DAC. Each of the coupled emitters of the transistor switches $80_i$ is connected to a current source $81_i$. Current sources $81_i$ are shown for simplicity in FIG. 3 as a single transistor $86_i$ whose collector is connected to the coupled emitters is connected in series with a resistor $88_i$ to supply voltage $V_{EE}$. Bias for the bases of transistors $86_i$ is supplied by a single bias voltage applied at terminal 90. Each of the transistor switches can contribute the same amount of current to the output. The DAC 76 further includes a pair of emitter-coupled transistors 92, 94 as a "dummy cell." The dummy cell is used in a feedback loop to control bias voltage $V_{BIAS}$, applied at terminal 90. The collector of transistor 92 is connected to one input of an operational amplifier, not shown, for sensing the collector current. The output of the operational amplifier generates the $V_{BIAS}$ voltage to bias the current sources to a desired operating current. Deviations and collector current produce offsetting changes in $V_{BIAS}$, to servo the collector current to the intended value.

In practice, of course, the circuitry will be somewhat more complex than appears from the functional diagram. The functional diagram does not show, for example, bias circuitry for the bases of the DAC switches. Also, the current sources are shown only figuratively and simplistically.

Figure 4:
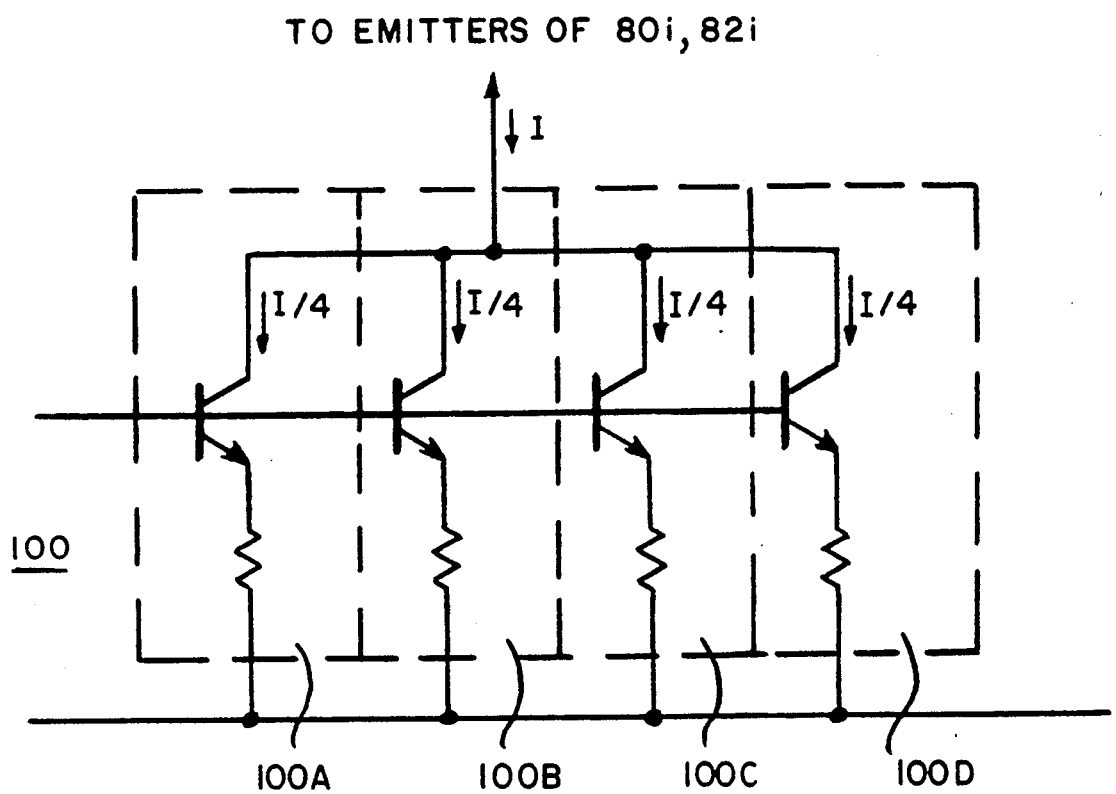
FIG. 4 is a simplified schematic circuit diagram of a current source according to the present invention, for use with one bit of the DAC of FIG. 3.

Referring to FIG. 4, a typical current source 100 will actually be seen, according to the present invention, to be formed of a plurality of current sources whose outputs are summed to give the desired total current. For example, if the current source 100 supplies the current for the MSB, it may be formed of four current sources, 100A, 100B, 100C, and 100D, each contributing only one-fourth of the total current I to switch transistors $80_N$ and $82_N$. In this fashion, sixty-four current sources can readily provide from a 5-bit digital input an analog output accurate to fourteen bits.

Having thus described the method of the present invention and having provided two exemplary embodiments of apparatus for practicing the method, it will readily be seen that the method may be employed in additional, diverse circuitry and architecture for data conversion. The invention is adaptable to numerous DAC's based on current summation and is readily extended to DAC's based on voltage summation, as well. Accordingly, it will be understood that the foregoing detailed descriptions and embodiments are offered by way of example only, and are not intended to be limiting. The invention is limited only as defined in the following claims and equivalents thereto.

What is claimed is:

1. For use in an analog-to-digital converter, an assembly comprising:
   (a) an n-bit flash converter having
      (i) $2^n - 1$ comparators, each comparator having inverted and non-inverted outputs, and
      (ii) encoding means for providing from the comparator outputs an n-bit binary word corresponding to the set of comparator outputs; and
   (b) a digital-to-analog converter (DAC connected to the flash converter and having
      (i) $2^n - 1$ electronic switches, each operable in response to the state of the outputs of an associated one of said comparators for connecting a current, supplied to said switch, to a current summing node at which an analog output current is to be provided, and
      (ii) means for generating said currents the means for generating said currents comprising, for at lest one of said switches, a plurality of current sources whose outputs are summed together, the number of current sources in said plurality being sufficient to provide a desired current to within a predefined tolerance, and with a predetermined level of confidence.

2. The apparatus of claim 1 wherein the number of current sources is at least equal to $(Z\sigma/E)^2$, where $\sigma$ is the standard deviation for the population of current sources from which the sample of current sources is taken, E is the error band or tolerance which is sought, and Z is a number representing the probability that the total current will be within said tolerance.

3. A digital-to-analog converter comprising:
   (a) a plurality of electronic switches, each operable in response to the state of a digital control signal applied thereto, for selectively connecting a current, supplied to said switch, to a current summing node at which an analog output current is to be provided; and
   (b) means for generating said currents, the means for generating said currents comprising, for at least one of said switches, a plurality of current sources whose outputs are summed together, the number of current sources is said plurality being sufficient to provide a desired current to within a predefined tolerance, and with the predetermined level of confidence.

4. The apparatus of claim 1 wherein the number of current sources is at least equal to $(Z\sigma/E)^2$, where $\sigma$ is the standard deviation for the population of current sources from which the sample of current sources is taken, E is the error band or tolerance which is south, and Z is a number representing the probability that the total current will be within said tolerance.

5. A digital-to-analog converter comprising:
   (a) decoder means for deciding N most significant bits of an N+M bit digital work;
   (b) delay means for receiving and delaying the M least significant bits of the digital word;
   (c) a set of transparent latches for receiving the outputs of the decoder means and the delay means and for supplying at least two sets of outputs responsive to the state of the latch control signal applied thereto;
   (d) a first digital-to-analog converter (DAC) connected to receive from the transparent latches a first set of outputs comprising a plurality of the most significant bits;
   (e) a second DAC for receiving from the transparent latches a second set of outputs comprising a plurality of less significant bits;
   (f) each of said DAC's supplying at least one output current, which output currents are summed to produce the analog output current of the digital-to-analog converter; and
   (g) the first digital-to-analog converter comprising
      (1) a plurality of electronic switches, each operable in response to the state of a digital control signal applied thereto, for selectively connecting a current, supplied to said switch, to a current summing node at which an analog output current is to be provided, and (2) means for generating said currents, the means for generating said currents comprising, for at least one of said switches, a plurality of current sources whose outputs are summed together, the number of current said sources in said plurality being sufficient to provide a desired current to within a predefined tolerance, and with the predetermined level of confidence.

6. The apparatus of claim 5 wherein the number of current sources is at least equal to $(Z\sigma/E)^2$, where $\sigma$ is the standard deviation for the population of current sources from which the sample of current sources is taken, E is the error band or tolerance which is sought, and Z is a number representing the probability that the total current will be within said tolerance.

* * * * *